United States Patent [19]

Konnemann

[11] 4,104,699

[45] Aug. 1, 1978

[54] ELECTRICAL CURRENT DISTRIBUTING ARRANGEMENT

[75] Inventor: Alfred Könnemann, Wuppertal, Fed. Rep. of Germany

[73] Assignee: Grote & Hartmann GmbH & Co KG, Wuppertal, Fed. Rep. of Germany

[21] Appl. No.: 748,543

[22] Filed: Dec. 8, 1976

[30] Foreign Application Priority Data

Dec. 11, 1975 [DE] Fed. Rep. of Germany ....... 2555708

[51] Int. Cl.² .............................................. H05K 1/02
[52] U.S. Cl. ..................................... 361/349; 337/297
[58] Field of Search ............... 361/346, 347, 349, 358, 361/360, 403, 418; 339/17 R, 17 C, 18 R, 18 C, 125 R, 126 R; 174/138 G; 337/297; 248/27.1

[56] References Cited

U.S. PATENT DOCUMENTS

| 2,863,131 | 12/1958 | Carlzen et al. ................. 174/138 G |
| 3,341,745 | 9/1967 | Munro .................................. 361/349 |
| 3,405,324 | 10/1968 | Alexander et al. ................. 361/403 |
| 3,585,556 | 6/1971 | Hingorany et al. ................. 337/297 |
| 3,701,075 | 10/1972 | Schullstrom et al. ............... 361/403 |

FOREIGN PATENT DOCUMENTS 1,176,022 1/1970 United Kingdom ................. 339/18 R Primary Examiner—David Smith, Jr.
Attorney, Agent, or Firm—Michael J. Striker

[57] ABSTRACT

A current-distributing arrangement for electrical components includes an electrical circuit board having opposite sides, and conductive paths at one of the sides. A mounting member is mounted at the other of the sides. This mounting member has first wall portions which bound first sockets, and second wall portions which bound second sockets and which are raised relative to the first wall portions in direction away from said one side of the board. Spring contact members each having resilient contact portions are located in the second sockets for receiving electrical components therein with which electrical contact is made. Each spring contact member has a solderable portion connected with the contact portions and extending away from the latter in direction from the other side of the board towards and beyond said one side thereof so that solder contact may be made with the conductive paths only at said one side of the board.

23 Claims, 5 Drawing Figures 4,104,699

ELECTRICAL CURRENT DISTRIBUTING ARRANGEMENT

BACKGROUND OF THE INVENTION

The present invention relates to current-distributing arrangements and, more particularly, to electrical current distributing arrangements for electrical components used with automobiles and analogous vehicles.

Electrical current distributing arrangements require connections for various components, such as relay strips, fuse strips, and analogous components, to input and output cable terminals. It has been proposed to obtain these circuit connections by permanent or fixed wiring or by using relatively large metallic members. However, such circuit connections have not proven altogether satisfactory, because they are costly to manufacture, particularly in mass production and, in addition, they occupy a relatively large working area which is especially undesirable in the case of automobiles where working space is at a premium.

It has also been proposed to obtain these circuit connections by arranging the various components on different sides of a housing. However, here again, the limited space available in the engine compartment makes access to the various components of the current-distributing arrangement very difficult. Thus, the prior-art proposals require a considerable amount of working space which, in turn, increases the costs of manufacture. Also, by arranging the various components on different sides of a housing, it is extremely difficult to solder all of the various electrical components at one time by automatically-operative machinery. Such solder connections must therefore usually be done by hand which is particularly time consuming and expensive.

SUMMARY OF THE INVENTION

Accordingly, it is the general object of the present invention to overcome the disadvantages of the prior art.

An additional object of the present invention is to simplify the construction of electrical current distributing arrangements for use with electrical components on board vehicles.

Another object of the present invention is to provide an extremely compact construction for such a distributing arrangement.

Still another object of the present invention is to reduce the expenses involved in manufacturing such distributing arrangements.

Yet another object of the present invention is to simultaneously solder all electrical connections.

Another object of the present invention is to provide a distributing arrangement which occupies a minimal amount of available space.

In keeping with these objects and other which will become apparent hereinafter, one feature of the invention resides, briefly stated, in a current-distributing arrangement for electrical components, which comprises an electrical circuit board having opposite sides, and conductive paths at one of the sides. A mounting member is mounted at the other of the sides of the circuit board. This mounting member has first wall portions which bound first sockets, and second wall portions which bound second sockets and which are raised relative to the first wall portions in direction away from said one side of the board. The distributing arrangement also comprises spring contact members, each having resilient contact portions in the second sockets for receiving electrical components so as to make electrical connection therewith, and a solderable portion connected with the contact portions and extending away from the latter in direction from said other side of the board towards and beyond said one side thereof so that solder contact may be made with the conductive paths of the printed circuit board only at said one side of the board.

In accordance with the present invention, the construction of the distributing arrangement is simple and compact. Also, by arranging all of the solderable portions at one side of the board, not only can the electrical connections with the conductive paths of the printed circuit board be made simultaneously, but also the electrical components can all be mounted at one side of the arrangement, thus providing excellent access to such components and reducing the amount of space occupied by the arrangement.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
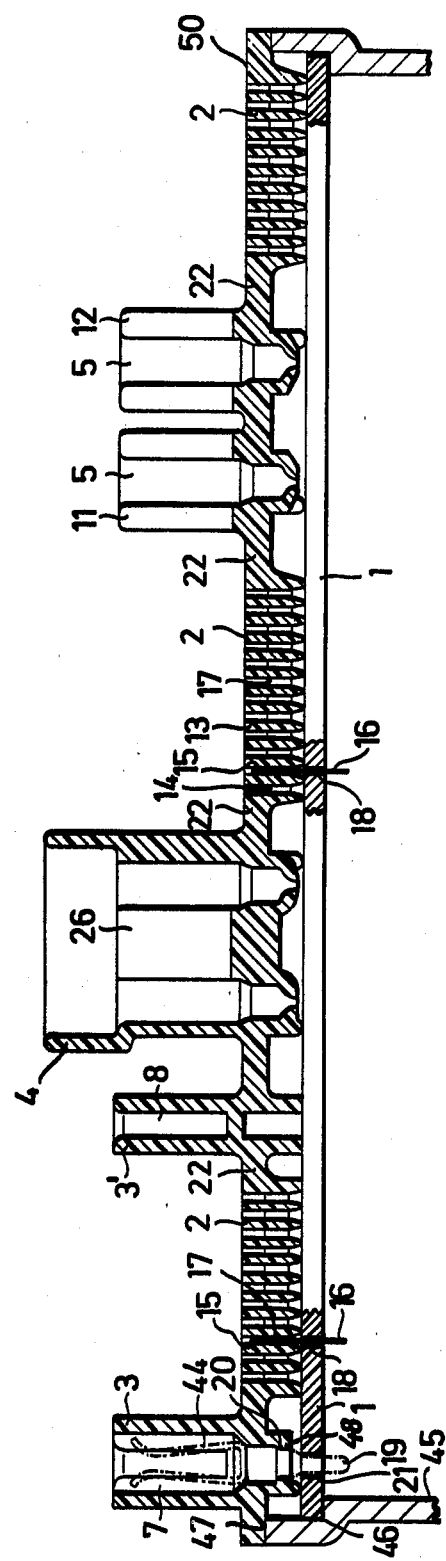
FIG. 1 is a partial view in cross-section of a current-distributing arrangement in accordance with the present invention.

Referring now to the drawings, and firstly to FIG. 1, it will be noted that reference numeral 1 identifies an electrical or printed circuit board of electrically-insulating material, preferably synthetic plastic material, having a plurality of transversely-extending conductive paths. Such conductive paths have not been shown in FIG. 1 for the sake of clarity, but have been shown instead in FIG. 4 and have been identified by reference numeral 1'. The manufacture of such printed circuit boards is well-known by screen printing, etching or photo-chemical techniques and is therefore believed not to require any further discussion.

A mounting member or plate 50 is mounted above board 1. The plate 50 has first wall portions 2 which bound first sockets 17, and second wall portions 3, 3', 4, 5 which bound second sockets. The second wall portions 3, 3', 4 and 5' are raised relative to the first wall portions 2, and are connected to each other by connecting wall portions or webs 22.

Figure 2:
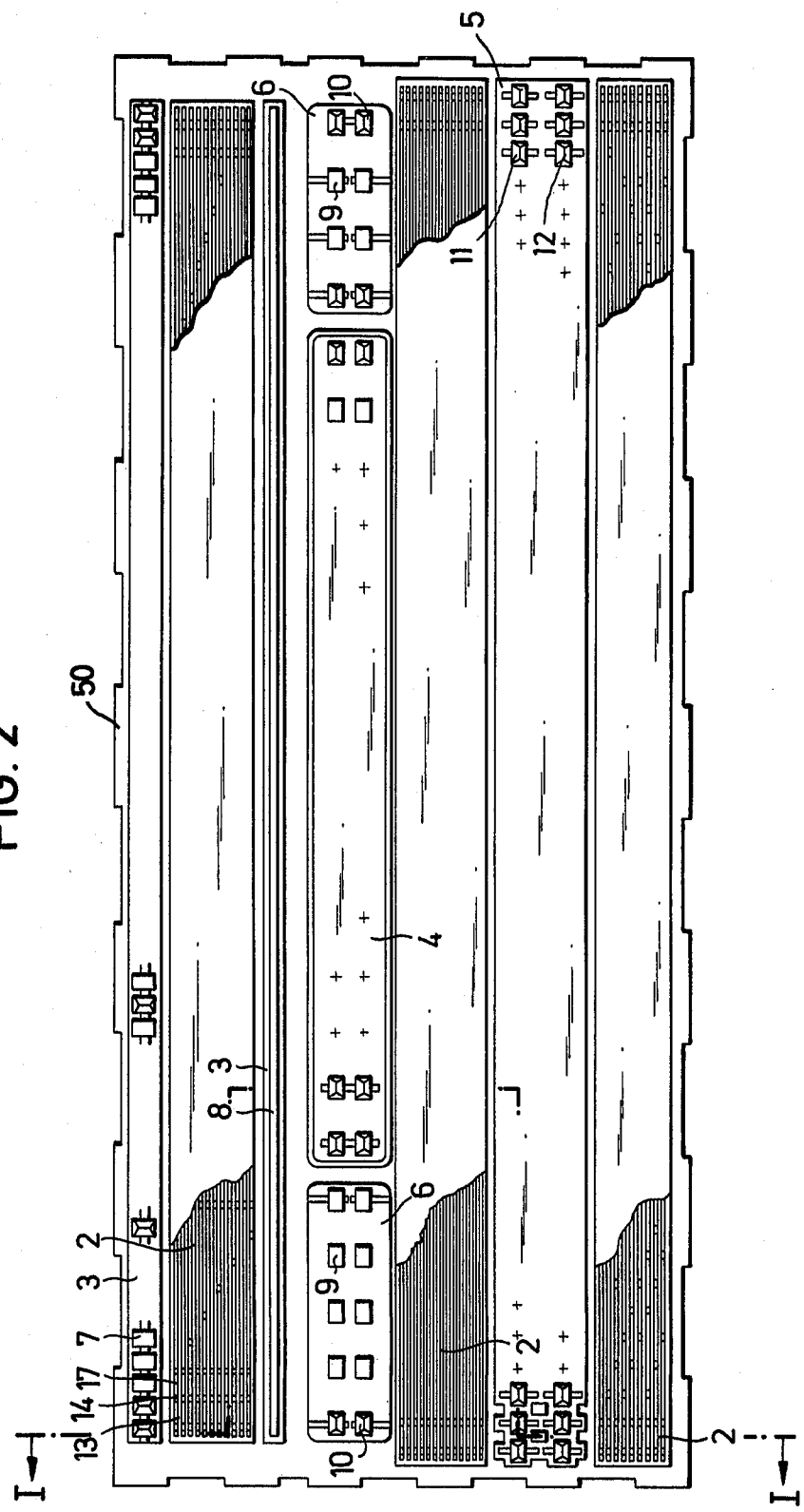
FIG. 2 is a top view of the arrangement of FIG. 1.

FIG. 2 shows a preferred arrangement of the various wall portions successively arranged in rows. As considered in direction transversely across the plate 50, i.e. from the upper longer side towards the lower longer side, the first row comprises wall portions 3 which are configurated to form a socket for receiving a contact strip 7 for relays. The second row comprises a set of wall portions 2 which lie adjacent to wall portions 3 and which are followed by a third row comprising wall portions 3' which are configured to form a socket 8 for a code strip which permanently supports a given relay and prevents insertion of another relay.

Figure 4:
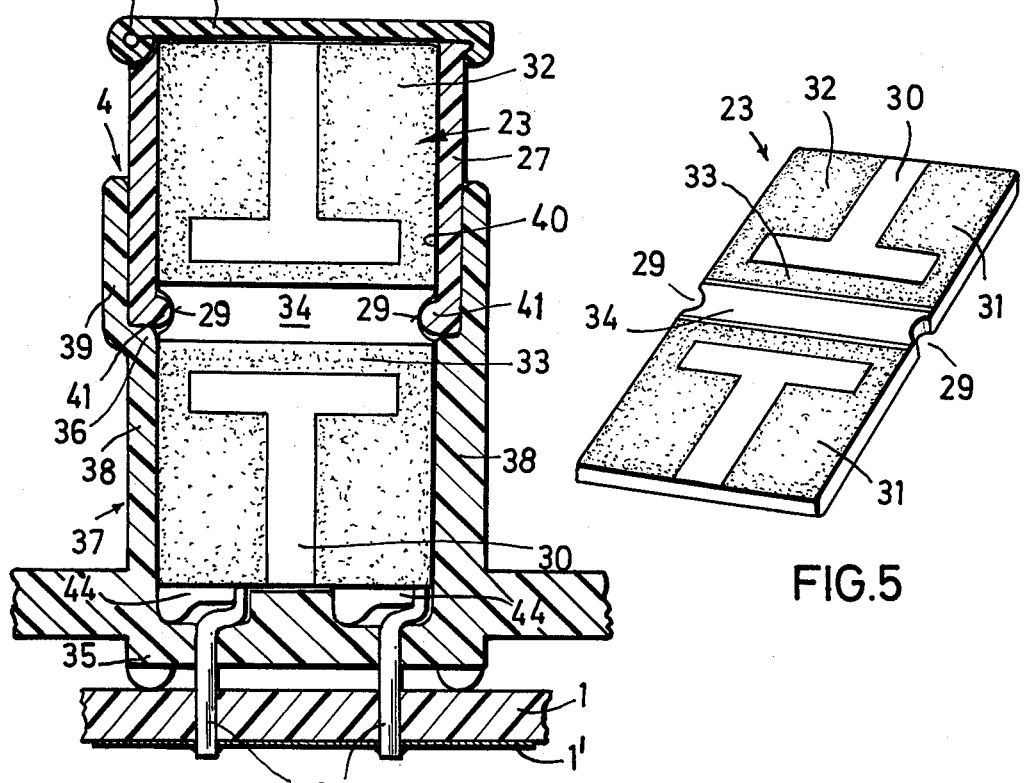
FIG. 4 is a partial view in cross-section of another detail of the arrangement of FIG. 1.

The next row comprises wall portions 4 which are configured to form a socket for receiving a fuse block assembly 37, as shown in detail in FIG. 4, and a pair of high-current strips 6 at opposite ends of the wall portions 4. Each high-current strip includes a current input terminal strip 9 and a current output terminal strip 10.

The next row comprises another set of wall portions 2 analogous to the first-mentioned set. The next row comprises nominally-rated current strip 5 which includes a current input terminal strip 11 and a current output terminal strip 12. The last row comprises still another set of wall portions 2 having conductive strips for interconnection with the conductive paths on the board 1.

The wall portions 2 are constituted of any electrically-insulating material, preferably synthetic-plastic material, and are comprised of a plurality of strip elements having longitudinal ribs 13 and cross ribs 14. The strip elements are generally parallel to each other and are successively arranged one behind another. Toothed metallic strip 15 is mounted between the longitudinal ribs 13, and its teeth or projecting portions 16 extend through passages 17 which are bounded by the wall portions 2. The teeth 16 also extend through hole 18 formed in board 1 and serve as a connective element to the conductive paths of the board 1.

The other raised wall portions 3, 3', 4, 5 and 6 are also constituted by any electrically-insulating material, preferably synthetic-plastic material, and define sockets in which spring contact members 44 are respectively mounted. The contact members 44 are fixedly mounted within the raised wall portions on plate 50 to prevent the contact members from being inadvertently misplaced, as well as protecting them from possible mechanical damage. All pins are therefore located in the interior of the arrangement, thus simplifying the same.

Figure 3:
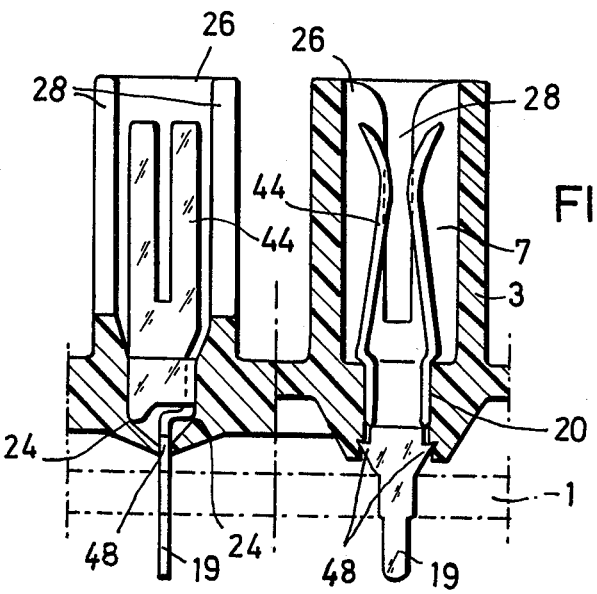
FIG. 3 is two partial views in cross-section of a detail of FIG. 1.

As shown in FIG. 3, the spring contact members 44 have a central slot so that each member 44 is configurated as a fork spring having spaced bifurcated legs. Each spring contact member 44 also has means or sawtooth shaped projections 48 for fixedly mounting the member 44 on the plate 50. The projections 48 engage seat 24 formed at an end region of a passage 20 in the plate 50 and serve to support the member 44 and prevent it from tipping over. The solderable portion 19 is connected to the spaced contact portions of each spring contact member 44 and extends towards and beyond a hole 21 formed in the board 1.

Figure 5:
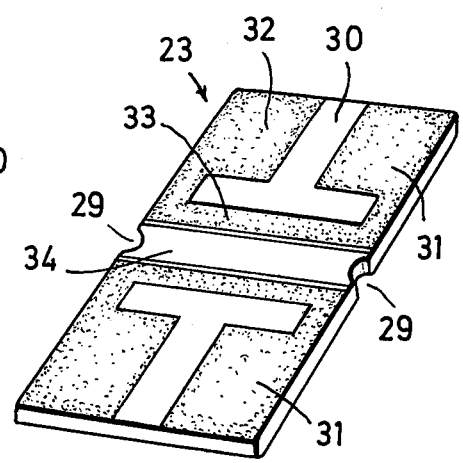
FIG. 5 is a perspective view of a detail of FIG. 4.

As shown in FIG. 4, the fuse block assembly 37 has a base portion 38 which includes a plurality of chambers 26, each arranged one behind another in the longitudinal direction. Each chamber 26 receives a fuse plate 23 as shown in FIG. 5, and two resilient contact members 44 receive a respective fuse plate 23. Each chamber 26 is so dimensioned that each fuse plate 23 is fixedly mounted therein.

Each fuse plate 23 is of generally rectangular configuration and comprises a pair of grooves 29, each disposed at a central region of a longer side of the fuse plate 23. At least one major surface is provided with a conductive path 31, as shown by stippling in FIG. 5. The same major surface is also provided with another conductive path 31 which is mirror-symmetrical to the first-mentioned path 31 relative to a dividing web 34. If desired, the opposite major surface, not visible in FIG. 5, may also be provided with such conductive paths. In use, inverting the fuse plate 23 by 180° will permit a worn fuse to be replaced by a fresh fuse.

Each conductive path 31 has a generally U-shaped configuration, i.e. each path comprises a closed end 33 and a pair of legs 32 on opposite sides of a non-conductive T-shaped region 30. The width of closed end 33 is approximately three times as large as compared with a leg 32.

The fuse block assembly 37 thus constitutes a plurality of such fuse plates 23 mounted in a corresponding number of chambers 26 of a base portion 38. This base portion 38 has a generally rectangular cross-section with support legs 35 adapted to engage board 1, and an offset portion 39 also of generally rectangular cross-section and forming a shoulder 36 with the base portion 38.

A cover member 27 has openings 40, each of which frictionally receives a portion of a fuse plate 23. In order to assure a tight frictional engagement between the cover member 27 and the fuse plate 23, projecting portions 41 are provided for engaging the grooves 29 of the fuse plate 23 with snap action. In use, the cover member 27 is inserted into offset portion 39 until the cover member 27 abuts against shoulder 36 and until the projecting portions 41 snap into grooves 29 of fuse plate 23.

The cover member 27 has a lid 42 hinged at joint 43. By removing the cover member 27 in direction away from the plate 50, all fuse plates 23 are simultaneously pulled out of each chamber 26. Thus, easy access to the fuse block assembly is obtained.

The high-current strips 6 and the nominally-rated current strips 5 also receive spring contact members, in a manner analogous to that described in connection with FIG. 3.

All projecting portions 19 of the spring contact members 44 and all teeth 16 of the metallic strips 15 project beyond the underside of printed circuit board 1 and can be soldered at this side of the board by flow-soldering techniques. Such one-step soldering causes all portions projecting beyond the board 1 to be simultaneously soldered.

In order to protect the plate 50 during soldering, a frame 45 is provided with flange portions 46 and 47. Board 1 rests on flange 46, and plate 50 rests on flange 47 in order to support plate 50 above board 1.

The electrical current distributing arrangement can be easily varied in order to adapt its circuit connections for a particular application. All current input and output terminals, fuses and relays, are arranged, in accordance with the present invention, at one side of the distributing arrangement. This means that the spaced occupied by the arrangement is kept at a minimum.

Inasmuch as the various sockets of the invention are elongated, a user may insert the plugs of electrical components to be mounted from above without having to take particular notice of the exact plug-in position.

For exemplary purposes only, a current distributing arrangement for a mid-sized automobile has the following dimensions: length 25 centimeters, width 10 centimeters, height 3.5 centimeters.

It will be understood that each of the elements described above, or two or more together, may also find a useful application in other types of constructions differing from the types described above.

While the invention has been illustrated and described as embodied in an electrical current distributing arrangement, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A current-distributing arrangement for electrical components, comprising an electrical circuit board having opposite sides, and conductive paths at one of said sides; an elongated mounting member mounted at the other of said sides, said mounting member having first wall portions which bound a plurality of first sockets, and second wall portions which bound a plurality of second sockets and which are raised relative to said first wall portions in direction away from said one side of said board said sockets being spaced from one another in and transverse to the direction of elongation of said mounting member; and spring contact members each having resilient contact portions for receiving electrical components so as to make electrical connection therewith and fixedly mounted within said second sockets so as to be protected from mechanical damage, and a solderable portion connected with said contact portions and extending away from the latter in direction from said other side of said board towards and beyond said one side thereof so that solder contact may be made with said conductive paths only at said one side of said board.

2. An arrangement as defined in claim 1; and further comprising a fuse plate for mounting in one of said second sockets.

3. An arrangement as defined in claim 1: and further comprising connecting wall portions extending intermediate said first and second wall portions for connecting the former to the latter.

4. An arrangement as defined in claim 1, wherein said first wall portions are of electrically-insulating material and are formed with ribs, said first wall portions being successively arranged on said mounting member so that each adjacent pair of first wall portions bound a respective one of said first sockets which has an open end facing said other side of said board.

5. An arrangement as defined in claim 4, wherein said circuit board has a through-hole; and further comprising an electrically-conducting strip having a main portion mounted in said first socket and a projecting portion extending through said open end and through said through-hole to a position beyond said one side of said board at which solder contact is made.

6. An arrangement as defined in claim 1, wherein said second wall portions are of electrically-insulating material.

7. An arrangement as defined in claim 1, wherein each spring contact member is bifurcated so that said resilient contact portions are spaced from one another; and wherein said mounting means includes support portions on each spring contact member for frictionally engaging said mounting member so as to support a respective spring contact member in upright position in a respective second socket.

8. An arrangement as defined in claim 7, wherein said circuit board has a through-hole, and wherein said second wall portions form a hole at one side of said socket; and wherein said solderable portion passes through both of said holes.

9. An arrangement as defined in claim 1, wherein said second wall portions are successively arranged on said mounting member so as to form a fuse block assembly, each adjacent pair of said second wall portions bounding a respective one of said second sockets.

10. An arrangement as defined in claim 9; and further comprising a fuse plate in each one of said second sockets of said fuse block assembly, each fuse plate being received by said spring contact members.

11. An arrangement as defined in claim 10, said fuse block assembly comprising a cover member mountable on said second wall portions, said cover member having a plurality of successively arranged slots each of which overly a respective one of said second sockets.

12. An arrangement as defined in claim 1, wherein each of said spring contact members is provided with a resilience-imparting slit.

13. An arrangement as defined in claim 11, wherein each fuse plate has two grooves located at opposite sides of said fuse plate and generally centrally of said fuse plate as considered in the direction of raising of said second wall portions; and wherein each fuse plate has a pair of mirror-symmetrical conductor paths arranged at opposite end regions of said fuse plate.

14. An arrangement as defined in claim 13, wherein each conductor path is generally U-shaped and has a closed path portion and a pair of side path portions.

15. An arrangement as defined in claim 14, wherein said closed path portion has a width dimension on the order of three times as large as the width dimension of one of said side path portions.

16. An arrangement as defined in claim 11, wherein said second wall portions of said fuse block assembly includes a base portion and an enlarged portion, said cover member being insertable into said enlarged portion.

17. An arrangement as defined in claim 16, wherein said enlarged portion is offset relative to said base portion so as to form a shoulder, and wherein said cover member is inserted into said enlarged portion until a leading end of said cover member abuts against said shoulder.

18. An arrangement as defined in claim 11, wherein each of said slots has a cross-sectional dimension such as to frictionally tightly receive a respective one of said fuse plates.

19. An arrangement as defined in claim 11, wherein said cover member has a hinged lid.

20. An arrangement as defined in claim 1; and further comprising a frame for supporting said board and said mounting member relative to each other, said frame having a first flange portion for engagement with said board, and a second flange portion for engagement with said mounting member.

21. A current distributing arrangement for electrical components, comprising a printed circuit board having opposite sides, through-holes extending intermediate said sides, and conductive paths at one of said sides; a mounting member mounted at the other of said sides, said mounting member having first wall portions which bound first elongated sockets, and second wall portions which bound second elongated sockets and which are raised relative to said first wall portions in direction away from said one side of said board; an electrically-conductive strip having a main portion in a respective one of said sockets, and projecting portions connected to said main portion and passing through one of said holes in direction towards and beyond said one side of said board; and spring contact members each having resilient contact portions fixedly mounted within said second sockets for receiving electrical components so as to make electrical connection therewith, and a solderable portion connected with said contact portions and passing rhrough another of said holes in direction from said other side of said board towards and beyond said one side thereof so that solder contact of said solderable portions and of said projecting portions may be made with said conductive paths only at said one side of said board.

22. A current-distributing arrangement for electrical components, comprising an electrical circuit board having opposite sides, and conductive paths at one of said sides; a mounting member mounted at the other of said sides, said mounting member having first wall portions which bound first sockets, and second wall portions which bound second sockets and which are raised relative to said first wall portions in direction away from said one side of said board said second wall portions being successively arranged on said mounting member so as to form a fuse block assembly, each adjacent pair of said second wall portions bounding a respective one of said second sockets, said fuse block assembly comprising a cover member mountable on said second wall portions, said cover member having a plurality of successively arranged slots each of which overly a respective one of said second sockets; spring contact members each having resilient contact portions in said second sockets for receiving electrical components so as to make electrical connection therewith, and a solderable portion connected with said contact portions and extending away from the latter in direction from said other side of said board towards and beyond said one side thereof so that solder contact may be made with said conductive paths only at said one side of said board; a fuse plate in each one of said second sockets of said fuse block assembly, each fuse plate being received by said spring contact members and having two grooves generally located at opposite sides of said fuse plate and generally centrally of said fuse plate as considered in the direction of raising of said second wall portions, each fuse plate having a pair of mirror-symmetrical conductor paths arranged at opposite end regions of said fuse plate; and means on said cover member for engaging said grooves with snap action when said cover member is mounted on said second wall portions of said fuse block assembly.

23. A current-distributing arrangement for electrical components, comprising an electrical circuit board having opposite sides, conductive paths at one of said sides and a through hole; an elongated mounting member mounted at the other of said sides, said mounting member having first wall portions of electrically-insulating material which bound first sockets, and second wall portions of electrically-insulating material which bound second sockets and which are raised relative to said first wall portions in direction away from said one side of said board, said first wall portions being formed with ribs and being successively arranged on said mounting member so that each adjacent pair of first wall portions bound a respective one of said first sockets which has an open end facing said other side of said board, all of said sockets being successively arranged on said mounting member in direction transversely of the elongation thereof and extending substantially parallel to each other and in direction of the elongation of said member; spring contact members each having resilient contact portions in said second sockets for receiving electrical components so as to make electrical connection therewith, and a solderable portion connected with said contact portions and extending away from the latter in direction from said other side of said board towards and beyond said one side thereof so that solder contact may be made with said conductive paths only at said one side of said board; and means for mounting said resilient contact portions within said second sockets so as to protect said resilient contact portions against possible mechanical damage; a fuse plate for mounting in one of said second sockets; an electrically-conducting strip having a main portion mounted in said first socket and a projecting portion extending through said open end and through said through-hole to a position beyond said one side of said board at which solder contact is made.

* * * * *